(12) United States Patent
Gonder

(10) Patent No.: US 8,564,276 B2
(45) Date of Patent: Oct. 22, 2013

(54) METHOD AND MEASUREMENT DEVICE FOR DETERMINING A CONDITION OF AN ELECTRIC IGNITER OF A GAS TURBINE BURNER AND AN IGNITION DEVICE FOR A GAS TURBINE BURNER

(75) Inventor: Jörg Gonder, Mülheim (DE)

(73) Assignee: Siemens Aktiengesellschaft, München (DE)

( * ) Notice: Subject to any disclaimer, the term of this patent is extended or adjusted under 35 U.S.C. 154(b) by 335 days.

(21) Appl. No.: 13/130,107

(22) PCT Filed: Jan. 20, 2009

(86) PCT No.: PCT/EP2009/050578
§ 371 (c)(1),
(2), (4) Date: May 19, 2011

(87) PCT Pub. No.: WO2010/057680
PCT Pub. Date: May 27, 2010

(65) Prior Publication Data
US 2011/0221422 A1    Sep. 15, 2011

(30) Foreign Application Priority Data

Nov. 21, 2008    (DE) .......................... 10 2008 058 571

(51) Int. Cl.
*G01R 19/00*    (2006.01)

(52) U.S. Cl.
CPC .................................. *G01R 19/0092* (2013.01)
USPC ...................................................... 324/76.11

(58) Field of Classification Search
None
See application file for complete search history.

(56) References Cited

U.S. PATENT DOCUMENTS

| 4,760,341 | A |  | 7/1988 | Skerritt |  |
|-----------|---|--|--------|----------|--|
| 5,116,764 | A | * | 5/1992 | Annino et al. | 436/161 |
| 5,775,895 | A | * | 7/1998 | Fenn et al. | 431/66 |
| 6,085,144 | A |  | 7/2000 | Tozzi |  |
| 2003/0168049 | A1 |  | 9/2003 | Zarkhin et al. |  |

FOREIGN PATENT DOCUMENTS

| DE |       19524499 A1 | 1/1997 |
|----|-------------------|--------|
| DE | 10 2006 005 711 A1 | 8/2007 |
| EP |        1892474 A1 | 2/2008 |

* cited by examiner

*Primary Examiner* — Paresh Patel

(57) ABSTRACT

A method for determining a condition of an electric igniter of a gas turbine burner and a measurement device for a gas turbine burner are provided. By means of the method and the measurement device it is possible to prevent false starts of gas turbines as a result of a nonfunctional igniter. The method provides for a time-dependent signal characterizing the ignition current of an igniter to be compared to an upper threshold value and a lower threshold value and at the same time to compare the characterizing signal to a mean target current value, by which the ignition current should fluctuate randomly when the igniter is functioning properly.

15 Claims, 3 Drawing Sheets

METHOD AND MEASUREMENT DEVICE FOR DETERMINING A CONDITION OF AN ELECTRIC IGNITER OF A GAS TURBINE BURNER AND AN IGNITION DEVICE FOR A GAS TURBINE BURNER

CROSS REFERENCE TO RELATED APPLICATIONS

This application is the US National Stage of International Application No. PCT/EP2009/050578, filed Jan. 20, 2009 and claims the benefit thereof. The International Application claims the benefits of German application No. 10 2008 058 571.8 DE filed Nov. 21, 2008. All of the applications are incorporated by reference herein in their entirety.

FIELD OF INVENTION

The invention refers to a method for determining a state of an electric igniter of a gas turbine burner, in which in a first step a time-dependent signal, which characterizes the ignition current of an igniter, is compared with an upper limit value and a lower limit value. In addition, the invention refers to a measuring device for determining a state of an electric igniter of a gas turbine burner, comprising a sensor for time-resolved measurement of the current of an electric igniter of a gas turbine burner, and an evaluation device, which is connected to the sensor, with at least one memory and with at least one means for comparing the signal which is made available by the sensor with at least one limit value which is stored in the memory. Furthermore, the invention refers to an ignition device for a gas turbine burner, comprising an igniter having two electrodes disposed opposite each other, between which electrodes an ignition spark can be generated by means of an ignition voltage, and an ignition transformer for generating the ignition voltage, which ignition transformer is electrically connected on the secondary side to the electrodes.

BACKGROUND OF INVENTION

An igniter of a gas turbine burner, which relates to the invention, is known from. EP 1 892 474 A1, for example. The burner which is described therein comprises a pilot burner which can be ignited with the aid of an igniter as soon as a combustible gas or combustible substance mixture flows through the pilot burner into the combustor of a gas turbine. The igniter which is known therefrom essentially comprises two ignition electrodes, extending parallel to each other, which in the region of the fuel outlet of the pilot burner are bent in relation to each other and have their smallest gap there in order to be able to generate an ignition spark in the region of the fuel outlet, by means of which the fuel or the mixture can be ignited. For generating the ignition spark, a sufficiently high alternating voltage, which is made available by an ignition transformer, is customarily applied to the two electrodes. The ignition voltage in this case may be several kilovolts (kV).

Damage or bending of one or both ignition electrodes, which are attached to the pilot burner, during transporting or installation can negatively affect the functional performance of the ignition electrodes. Furthermore, on account of thermally induced expansions, cracks may occur in the insulation of the ignition electrodes or in the worst case the ignition electrodes may break so that despite an applied ignition voltage the igniter provides no ignition spark at the fuel outlet of the pilot burner. Equally, it is possible that after a so-called off-line compressor wash the electrodes are still wetted by a compressor washing fluid which also prevents the generation of an ignition spark despite an applied ignition voltage on account of ensuing creep currents. These defects can lead to failed starts which are undesired and also possibly damaging for the gas turbine.

For monitoring the igniters and the ignition spark, a device is known from U.S. Pat. No. 4,760,341. The device monitors the duration and the amplitude of the ignition spark and also the negative portion of the waveform of the spark charge. The igniter state, or the ignition spark, is recognized as being in accordance with specification if the duration of the ignition spark does not exceed a maximum time, the amplitude of the ignition spark has a minimum value and at the same time the negative portion exceeds an acceptable minimum value. It is disadvantageous that this device is not suitable for monitoring the ignition process in the case of gas turbines.

SUMMARY OF INVENTION

Accordingly, the invention is based on the object of disclosing an ignition device for a gas turbine burner, by means of which the state of an electric igniter of a gas turbine burner can be simply and reliably determined. A further object of the invention is the disclosure of an efficient method for determining the state of the electric igniter of the gas turbine burner, and a measuring device for it, in order to avoid failed starts of gas turbines.

The object which is directed toward the method is achieved by means of a method according to the features of the claims. The object which is directed toward a measuring device is achieved with such a measuring device according to the features of the claims, and the object which is directed toward an ignition device is achieved with such an ignition device according to the features of the claims.

The invention is based overall on the knowledge that during igniting of the igniter of a gas turbine burner, an electric arc-like ignition spark, the current value of which is specific, is generated at the tip of the igniter. Since before the opening of the fuel valves of the pilot burner or also of a main burner of the gas turbine burner the ignition spark must be available on the igniter for a minimum duration, the monitoring of the ignition current which is flowing in the process is expedient in order to establish in which state the electric igniter of the gas turbine burner is in. The method according to the invention in a first step provides that a time-dependent signal, which characterizes the ignition current of an igniter, is to be compared with an upper limit value and a lower limit value in order to establish whether the igniter is unserviceable or serviceable. Furthermore, it is proposed that in a further step, which is to be carried out at the same time, the characterizing signal is compared with a set-point current mean value. The invention is specifically additionally based on the knowledge that the magnitude of the ignition current, and therefore the magnitude of the signal which characterizes the ignition current, must lie not only within a prespecified tolerance band but that the ignition current which flows for the duration of the ignition spark also has to fluctuate around a set-point current mean value on account of the flickering of the electric arc or spark. Consequently, not only the prevailing value of the ignition current is monitored for minimum/maximum falling short or exceeding, but also the time lapse of the ignition current is monitored in order to establish whether the igniter is serviceable or not. If the ignition current which is established in the case of a defect-free ignition device and fluctuates around the set-point current mean value is not encountered, then the ignition device in question is unserviceable.

According to the invention, therefore, not only is the actual ignition current checked for an upper limit value and for a lower limit value in a first step, but it is also checked for a mean value around which this fluctuates randomly as a rule in the case of a serviceable igniter.

If the ignitability of the igniter should have been impaired by water, short circuits or even creep currents may occur, which result in a constant current flow which therefore does not alternate around the set-point current mean value but is possibly even within the tolerance band. On account of the short circuits or creep currents, no ignition spark is generated between the electrode tips. It can also be that an ignition spark is generated not at the electrode tips but anywhere on the path between electrode and gas turbine casing. This ignition spark, however, lies in an environment in which it is not influenced by the air mass flow of the compressor so that the signal which alternates around the set-point current mean value is absent. Also, these malfunctions can be recognized as such by the proposed method.

As a result of using the method according to the invention and the devices according to the invention, the starting availability of gas turbines can be further improved since, on account of the knowledge about the state of the igniter, or of the igniters, failed starts on account of defective or unserviceable igniters are avoided. Measures for remedying the possibly temporary inoperability of the igniters and/or for repairing defective igniters can then be carried out in good time without failed starts of the gas turbine occurring as a result of these.

The upper limit value and the lower limit value and/or the set-point current mean value are time-dependent in each case. Consequently, the time-dependent upper and lower limit values form a setpoint—current envelope curve and the time-dependent set-point current mean value forms a set-point current trend characteristic. This is especially advantageous when, during provision of the ignition spark (equal to ignition duration), the environmental conditions of the ignition spark change, which also involves a change of the ignition current. This is the case, for example, when the ignition spark has to be made available during a changing speed of a rotor of the gas turbine since as a consequence of the changing rotor speed the air mass flow which is drawn in by the compressor also changes. The changed air mass flow similarly leads to a change of the amount of air which flows past the igniters. As a result of this, the ignition spark is influenced, which is reflected in the magnitude of the ignition current. In this respect, for varying boundary conditions of the ignition spark it is expedient to take, as a basis for the method, variable and therefore time-dependent limit values or mean values, with which the ignition current or the signal which characterizes the ignition current is compared.

On account of the increasing rotor speed when running up the gas turbine—even before starting the gas turbine, i.e. even before the combustion of fuel—the air mass flow is increased and directed along the burners of the combustor so that an existing ignition spark is influenced by the air draft, which leads to the reduction of the ignition current.

Advantageous developments are disclosed in the dependent claims.

According to an advantageous development of the invention, the state of the igniter is determined as being unserviceable if the characterizing signal lies outside the interval which is fainted by the upper limit value and lower limit value for a first minimum duration. Consequently, the exceeding of the upper limit value or the falling short of the lower limit value by the setpoint current value shall only lead to an "igniter unserviceable" message being indicated to the operator when the ignition current lies outside the interval for a minimum time span, preferably for three seconds. As a result of this, random error messages and false indications shall be excluded. Similarly, the interval can consequently be made even narrower than in the case of a method which does not monitor the duration of the falling short or exceeding of the limit value in question.

According to a specially preferred method, the state of the igniter is determined as being unserviceable if the characterizing signal does not fluctuate around the set-point current mean value or set-point current trend characteristic for a second minimum duration. On account of the dependency of the ignition current upon the randomness of the ignition spark and upon the air flow which envelops it, the igniter state can be identified as being unserviceable if this randomness in the magnitude of the ignition current is absent for a second minimum duration, preferably for three seconds. In other words: the set-point current mean value or the set-point current trend characteristic, which as a rule is located in the middle between the upper limit value and the lower limit value, represents a value around which the actually ensuing ignition current randomly fluctuates as long as an ignition spark is made available at the provided ignition position by the two electrodes of the igniter. If, for example, on the other hand a short-circuit current across the burner ensues on account of a breakage of ignition electrodes or an insulation failure of an electrode, a current flow which fluctuates around the set-point current mean value or set-point current trend characteristic is absent, which points toward an unserviceable igniter. In this respect, the monitoring of the actual current flow for a current flow which randomly fluctuates around a set-point current mean value or set-point current trend characteristic especially offers a particularly efficient monitoring criterion by means of which the state of the igniter can be determined in an exceptionally reliable and safe manner.

In order to measure a comparatively small ignition current, it is advantageous if the primary-side current of an ignition transformer is measured as the ignition current if an ignition transformer is provided for generating the ignition voltage of the ignition electrodes. As a result of this, the use of commercially-available, spatially compact sensors, for example current transformers, current measurement transducers or Hall-effect sensors, can be made possible.

Instead of, or in addition to, comparing whether the actually occurring detected ignition current varies within the set-point current envelope curve, a pattern comparison of current flows can also be carried out in order to establish whether the monitored igniter is serviceable or not. For this purpose, a reference flow (reference pattern) of the ignition current is measured in advance after shutting down the gas turbine, i.e. after shutting off the fuel feed with the rotor still turning. In this phase, the igniters are started and for a prespecified time period, for example for 10 seconds, the current flow of the igniter is measured and stored. The reference pattern can subsequently be compared with ignition current flows which are measured before starting the gas turbine.

The method for determining the state of the igniter is preferably carried out during rotation of a rotor of the gas turbine or before starting the gas turbine. As a result of this, the time period up to the starting of the gas turbine can be reduced since checking for operability of the igniters is already carried out during run-up but still with no light-up of the gas turbine.

When running up the gas turbine, the speed of the rotor customarily changes. As a rule it is steadily increased. In order to determine in advance the influences of the boundary conditions which affect the starter gap or ignition spark, it is expedient to determine the current flow of a serviceable igniter, from which the set-point current trend characteristic is determined. In order to ensure that the serviceable igniter is checked in a dry state, the determining of the current flow, which is taken as a basis for the set-point current trend characteristic, is to be realized after shutting down the gas turbine. For the determined values, an interpolation, preferably by means of a polynomial, is carried out, from which as a trend characteristic an expected value for the set-point current, around which the ignition current fluctuates in reality, can be determined. Providing the rotor speed remains constant, the set-point current mean value can be thus determined.

According to a further advantageous method of the invention, each igniter of a gas turbine is checked for operability, from which the number of serviceable igniters for the gas turbine results. If the number of serviceable igniters lies below a minimum number of serviceable igniters, wherein the minimum number is less than the number of igniters or burners, then the start permission of the gas turbine is refused, which leads to the fuel feed not being immediately opened. If, for example, the minimum number of serviceable igniters is not achieved after the off-line compressor wash, it is expedient to dry the igniters by means of a preheating process. After this, a further start attempt can be carried out. Equally, it is possible, after carrying out a preheating phase, to carry out a repeated check of each igniter in order to establish whether in the meantime a sufficient number of serviceable igniters are available. This method—regardless of the method used for determining the state of the igniter—is expedient especially in the case of gas turbines with annular combustors, in which a number of burners open into a common combustion chamber, as a result of which lighting of non-ignited burners can also be brought about by that flame which is directly adjacent to the burner in question.

BRIEF DESCRIPTION OF THE DRAWINGS

Further advantages and features of the invention are explained in the subsequent figure description. In this case, in the drawing.

DETAILED DESCRIPTION OF INVENTION

Figure 1:
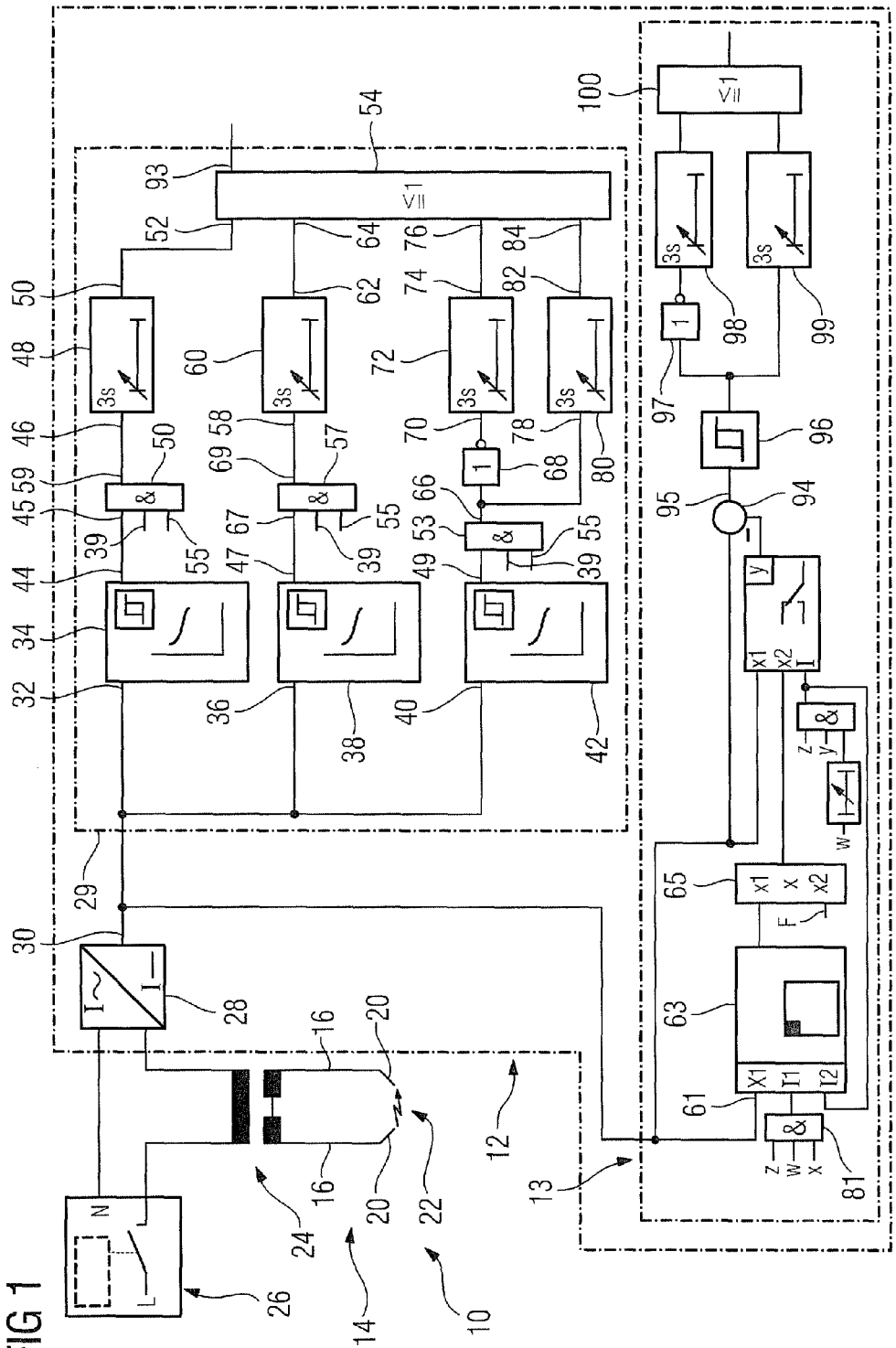
FIG. 1 shows a schematic plan of an ignition device with a measuring device.

In FIG. 1, an ignition device 10 and also a measuring device 12 for determining a state of an electric igniter 14 of a gas turbine burner is schematically shown. The ignition device 10 comprises an igniter 14, having two electrodes 16 disposed opposite each other, between the electrode tips 20 of which an ignition spark 22 can be generated by means of an ignition voltage which can be applied to the electrodes 16. The two electrodes 16 are electrically connected to a secondary winding of an ignition transformer 24. The primary winding of the ignition transformer 24 is connected to a switchable alternating current source 26, wherein a current measurement transducer 28, as a sensor, by means of which a signal which characterizes the primary-side ignition current can be measured for further processing, is connected in series to the ignition transformer 24. A primary-side terminal of the ignition transformer can be electrically connected in this case via a switch to the phase L, and the other terminal of the primary side of the ignition transformer 24 is connected via the current measurement transducer 28 to the neutral conductor N. The electrodes 16 in this case can be, for example, the electrodes of the igniter of a pilot burner or main burner of a gas turbine, with which a fuel gas, a combustible fuel gas-air mixture or an oil-air mixture can be ignited as a result of the provision of an ignition spark 22. In this case, both the burner and the electrodes 16 can especially be formed according to the design shown in the European Patent Application with the application number 06017534.6 (published as EP 1 892 474 A1). The signal which characterizes the ignition current is made available at the output 30 of the current measurement transducer 28 as soon as the switch of the alternating current source 26 is closed. The characterizing signal can then be fed to an evaluation device 29 which in the main comprises three limit-value monitors 34, 38, 42, three AND-gates 50, 57, 53, four timers 48, 60, 72, 80 and one OR-gate 54.

In detail, the output 30 of the current measurement transducer 28 is connected to an input 32 of the first limit-value monitor 34. Furthermore, the output 30 is connected to an input 36 of the second limit-value monitor 38 and to an input 40 of the third limit-value monitor 42. The output 44 of the first limit-value monitor 34 is connected to the input 45 of the first AND-gate 50, the output 59 of which is connected via the input 46 of the timer 48 and its output 50 to the input 52 of the OR-gate 54. An output 47 of the second limit-value monitor 38 is connected to an input 67 of the second AND-gate 57, the output 69 of which is connected in turn via the input 58 of the second timer 60 and its output 62 to an input 64 of the OR-gate 54. An output 49 of the third limit-value monitor 42, via the third AND-gate 53 and its output 66, reaches, via the input of the inverter 68, an input 70 of the third timer 72, the output 74 of which is connected to an input 76 of the OR-gate 54. Furthermore, the output 66 of the third AND-gate 53 is connected to an input 78 of the fourth timer 80, the output 82 of which is connected to a fourth input 84 of the OR-gate 54. The three AND-gates 50, 57, 53, as an enabling lock, ensure that the ignition current which is to be monitored can be compared with the limit values—stored in the memory—of a reference current (set-point current mean value) with the same ambient conditions and can be started at comparable time points. For this purpose, signals for "speed greater than 5.5 Hz" and "ignition on" can be sent through in each case to the inputs 39, 55 of the AND-gates 50, 57, 53. With the aid of the condition that the rotor speed is greater than a limiting speed of 5.5 Hz (=5.5 Hz×60 sec.=330 $min^{-1}$), it can be checked whether the gas turbine is in the running-up process or not (rotor speed is less than 5.5 Hz). The signal of an output 93 of the OR-gate 54 is indicated to an operator of the gas turbine. If a logic "1" signal is present there, the state of the igniter 14 in question is indicated to the operator as being unserviceable. If no off-line compressor wash was carried out directly before the check, this points to a defective igniter 14.

At a speed of 6.2 Hz, with feed of the ignition voltage (="ignition on") by means of the switchable alternating voltage source 26 to the ignition transformer 24, the method for determining the state of the igniter 14 is started by comparisons being carried out in each limit-value monitor 34, 38, 42 after this time point. The signal which is supplied by the current measurement transducer 28 at its output 30 and represents the primary-side ignition current is monitored by the first limit-value monitor 34 in conjunction with the enabling locking by means of the AND-gate 50, and also with the first timer 48. In the first limit-value monitor 34, at least one upper limit value is stored and compared with the signal which is present at its input 32. The first limit value represents a maximum permissible current magnitude of the ignition current. If the applied signal is above the first limit value, then a logic "1"

signal is present at the output 44 of the first limit-value monitor 34, which signal is transmitted via the AND-gate 50 by the first timer 48 to its output 50 as long as the logic "1"-signal is applied without interruption for a minimum time period, for example for 3 seconds, at the input 46 of the first timer 48.

The second limit-value monitor 38, the second AND-gate 57 and the second timer 60 operate in a similar way, wherein, however, the signal which is applied at the input 36 of the second limit-value monitor 38 and characterizes the ignition current is compared with a second limit value which is stored in the second limit-value monitor 38, wherein the second limit-value monitor 38 provides a logic "1"-signal at its output 47 as soon as the characterizing signal lies below the second limit value. The second limit value represents a minimum permissible magnitude of the ignition current.

Via the second AND-gate 57 and also with the aid of the second timer 60, the logic "1"-signal which is provided by the output 47 is transmitted to the OR-gate 54 if this is present without interruption at the input 58 of the second timer 60 for a minimum duration, for example for 3 seconds.

The third limit-value monitor 42 operates in conjunction with the third AND-gate 53, with the inverter 68 and with the third and fourth timers 72, 80 in a similar way. The output 74 of the third timer 72 and the output 82 of the fourth timer 80 feed in each case a logic "0"-signal if the characterizing signal at the input 40 of the third limit-value monitor 42 is present without interruption for no longer than a minimum duration, for example for three seconds, above or below a third limit value which is stored in the third limit-value monitor 42. The third limit value corresponds to the set-point current mean value which lies in the middle between upper and lower limit values. The signal which is present at the input 40 must therefore fluctuate around the third limit value so that the outputs 74, 82 of the third and fourth timers 72, 80 constantly feed a logic "0"-signal. If the current flow which fluctuates around the third limit value is absent for longer than three seconds, one of the two timers 72, 80 sends out a logic "1"-signal.

At the output 93 of the OR-gate 54, the state of the igniter 14 can then be identified, wherein with sending out a logic "1"-signal the state of the igniter 14 is defined as being unserviceable and with sending out a logic "0"-signal the state is serviceable.

The limit values which are stored in the three limit-value monitors 34, 38 and 42 can be time-dependent in this case, wherein the limit value which is stored in the first limit-value monitor 34 forms the upper limit value of a set-point current envelope curve, the limit value which is stored in the second limit-value monitor 38 forms the lower limit value of the set-point current envelope curve, and the third limit value which is stored in the third limit-value monitor 42 then represents the set-point current mean value around which the ignition current customarily fluctuates if there is a serviceable igniter 14 and the ignition voltage at the electrode tips 20 generates an ignition spark 22. In this respect, the first and second limit-value monitors 34, 38 are designed in each case as a limit-value comparator, and the third limit-value monitor 42 is designed as a comparator which monitors the signal which is present at its input 40 and characterizes the current flow of the ignition current for a fluctuating characteristic.

Figure 2:
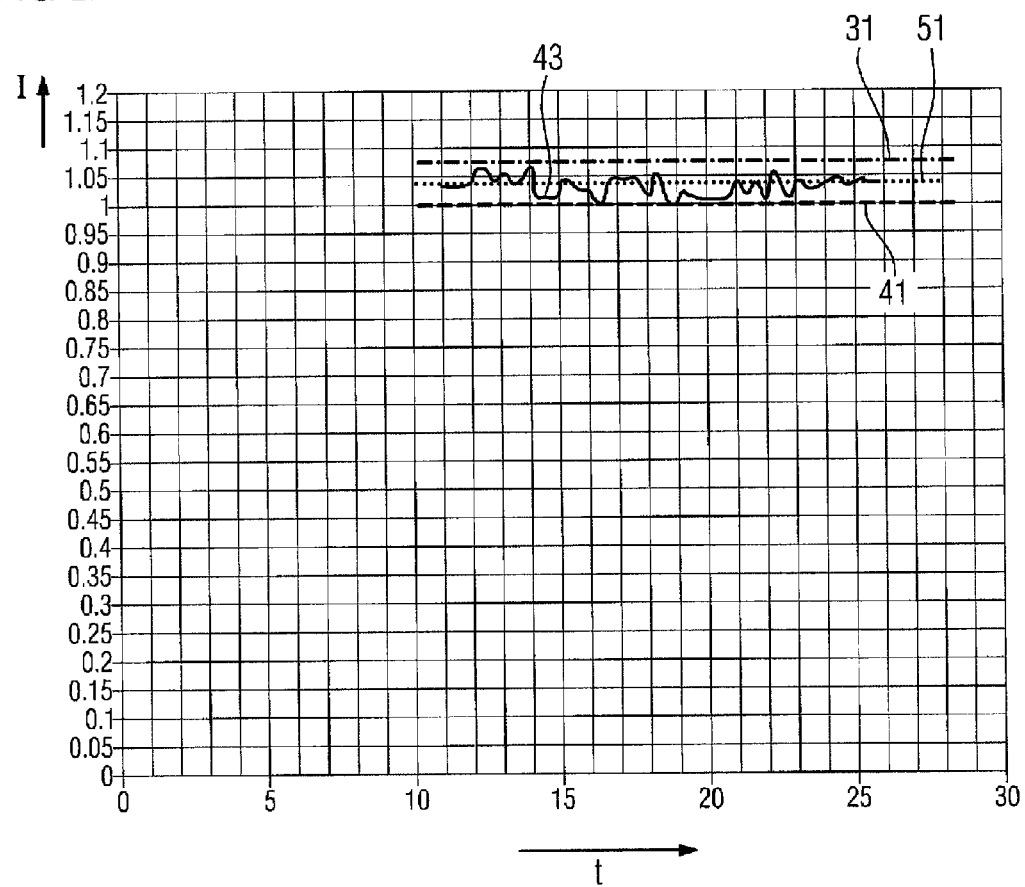
FIG. 2 shows the time lapse of the ignition current during the ignition duration of an igniter of a burner of a gas turbine at a rotor speed of 2 Hz.

In FIG. 2, an exemplary current flow through a serviceable igniter 14 of the burner of a gas turbine is shown. According to this, a time is plotted on the abscissa, whereas the ignition current, or the signal characterizing the magnitude of this, is plotted on the ordinate.

In FIG. 2, the actual current flow which is detected by the current measurement transducer 28 is shown in a line 43. The depicted current flow 43 in this case reflects an example of a current flow which occurs in the case of serviceable igniters 14.

The current flow was determined at an especially low rotor speed, for example 2 Hz, which occurs before start-up. The value of 2 Hz corresponds to a rotor speed of 120 revolutions per minute. On account of the comparatively low rotor speed of the gas turbine, the compressor which is associated with the gas turbine draws in a comparatively small amount of air, as a result of which the air which is pumped through the burners and through the turbine is without appreciable influence upon an ignition spark 22 which is provided at the tip 20 of the electrodes 16. If at such a low rotor speed the method according to the invention is carried out, processing can be carried out with temporally constant limit values.

The method provides for the use of three limit values. The first limit value, which can also be referred to as the upper limit value, represents in this case the maximum permissible current flow of the igniter 14. The upper limit-value characteristic is shown in FIG. 2 in a dot-dash line style and provided with the designation 31. The upper limit-value characteristic 31 according to FIG. 2 shows a temporally constant limit value which can be stored in the first limit-value monitor 34.

The second limit value, which can be referred to as the lower limit value, is shown in a dashed line style. The temporally constant limit value according to FIG. 2 is represented by means of a lower limit-value characteristic 41. The upper limit value 31 and the lower limit value 41 in this case form a set-point current envelope curve, or interval, in which the actually occurring ignition current must lie, or lies, in the case of a serviceable igniter 14 at low rotor speed. The third, also temporally constant limit value, which represents the set-point current mean value, is shown in FIG. 2 in dotted line style 51.

On account of the comparatively low rotor speed, the influence of the air, which flows past the tips of the electrodes 16, upon the ignition spark 22 is comparatively little, so that in the limit-value monitors 34, 38, 42, with constant limit values 31, 41 and 51, the functioning capability of the igniter in question can be monitored.

Since the ignition spark 22 of the igniter 14 is formed as an electric arc, the ignition current and its characterizing signal fluctuate around the third limit value 51 which lies in the middle between the upper and lower limit values 31, 41. If the current flow 43 of the ignition current which randomly fluctuates around the third limit value 51 does not establish itself, this points toward an unserviceable igniter 14.

Figure 3:
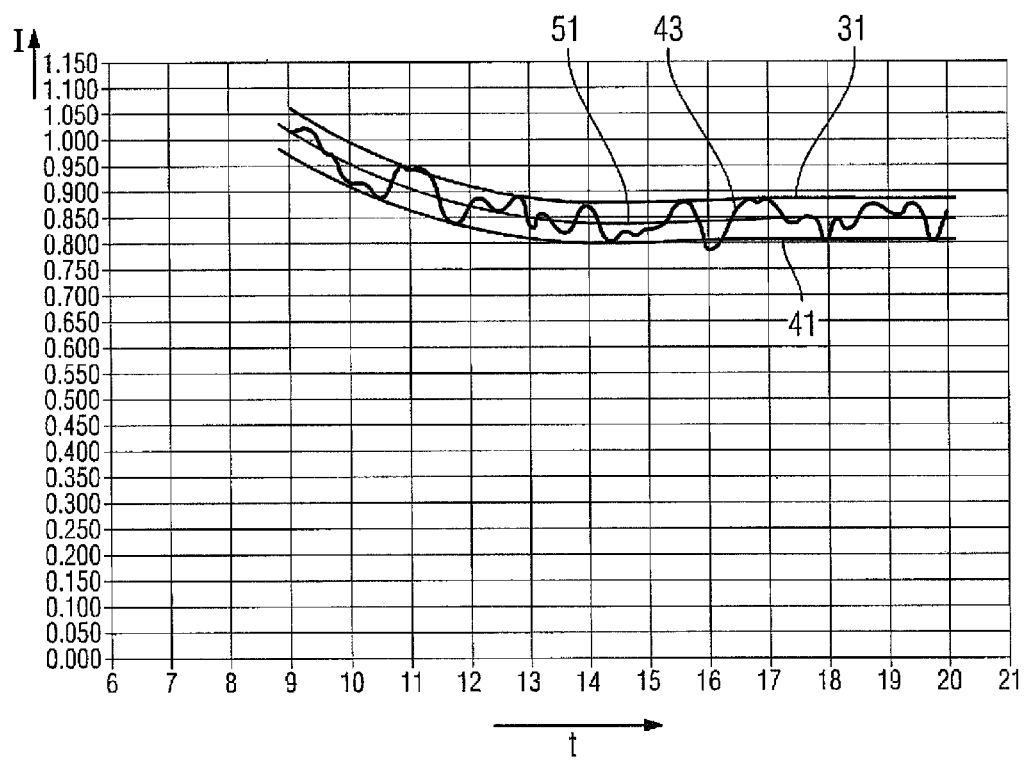
FIG. 3 shows the time lapse of the ignition current when running up the gas turbine.

FIG. 3 shows a diagram, similar to FIG. 2, in which the time is plotted on the abscissa and the ignition current is plotted on the ordinate. In the diagram, the first, now time-dependent, upper limit value 31 is shown. Represented by 41 is the second, also time-dependent limit value which represents a lower permissible limit for the ignition current in dependence upon time. The time-dependent upper limit value 31 and time-dependent lower limit value 41 in this case form an envelope curve for the ignition current, in which the actually occurring—but random in its magnitude—ignition current can vary if the igniter 14 is serviceable. In the middle between the upper limit value 31 characteristic line and lower limit value 41 characteristic line, a set-point current trend characteristic 51 line, which is also time-dependent in its magnitude, runs parallel to these.

If the method according to the invention for determining the state of an electric igniter 14 of a gas turbine burner is carried out during the running-up process of the gas turbine, during which the rotor speed is steadily increased, then with the aid of the now time-dependent limit values a further improved method for monitoring the igniter 14 can be disclosed. On account of the steady increases of the speed of the rotor, which is driven by an external rotary device, the amount of air which is drawn in the meantime by the compressor is steadily increased. The amount of air which is drawn in by the compressor is also partially guided past the igniters 14 of the gas turbine burner in the process so that the environmental conditions of the ignition spark also steadily change as the amount of air which is guided past increases. On account of the change of the environmental conditions of the ignition spark 22, its ignition current also changes. In order to be able to carry out the check of the igniter 14 for operability despite running up the gas turbine from a low rotor speed, for example 2 Hz, to a higher rotor speed, for example 7.2 Hz, inside of ten seconds, the limit values 31, 41, 51, which form the basis of the method, are stored as time-dependent variables in the limit-value monitors 34, 38, 42 and are taken as the basis for the comparisons which are constantly carried out therein. Also in this case, the comparisons are carried out after that time point after which the ignition voltage is applied to the ignition transformer 24 by the switch of the switchable alternating voltage source 26.

The determining of the limit values 31, 41 and 51 can be carried out after shutting down the gas turbine, for example, at a corresponding rotor speed. For this purpose, a test ignition is carried out once or repeatedly during start-up of the gas turbine, during which all the fuel valves remain closed and therefore no combustible mixture or fuel discharges from the fuel outlets. For the duration of the test ignition, the ignition current flow is determined, from which with the aid of an interpolation, using a polynomial of the third degree, a set-point current trend characteristic can be determined. As a result of determining a plurality of such set-point current trend characteristics and as a result of their averaging, further random influences can be excluded. The upper limit value, or the upper limit value characteristic 31, and the lower limit value, or the lower limit value characteristic 41, can then be determined by simple parallel shift, i.e. by addition or subtraction of a permissible current deviation of the ignition current.

Instead of comparing whether the actual ignition current lies within the envelope curve and varies around the trend value, a pattern comparison of current flows can also be carried out in order to establish whether the igniter 14 which is monitored by the measuring device 12 is serviceable or not.

Consequently, the measuring device 12 can have a device 13 for pattern monitoring, alternatively to the evaluation device 29 or in addition to it. The signal of the current measurement transducer 30 which characterizes the ignition current can be fed to an input 61 of a writable time and data register 63. With the aid of a multiplier element 65, the current values which are stored in the time and data register 63, or the values which represent the determined current flow, can be multiplied by a factor F if a later comparison of the stored values with an actual current flow is to be carried out, which comparison is carried out at a different rotor speed to that at which the values which are stored in the time and data register were determined.

For the purpose of measuring the reference flow (reference pattern), the ignition current is determined after shutting down a gas turbine (coast-down operation). The ignition transformer 24 is then enabled for ten seconds at a constant rotor speed of 2 Hz, as soon as this is achieved. In the meantime, the ignition current is continuously measured and its flow is stored as time-dependent values in the time and data register 63. In order to store the values which are present at the input X1, a logic "1"-signal is applied in the meantime at the input I1 of the time and data register 63. The conditions for fulfilling the logic "1"-signal at the input I1 are linked via an AND-gate 81: the result of the condition "exit temperature still greater than 100° C.?" is fed to the input X, the result "ignition on?" is fed to the input Z, and the result "washing was not previously carried out?" is fed to the input W. With the aid of the measurement, the flow of the ignition current of a serviceable igniter 14 is now obtained at a so-called turning speed of 2 Hz of the rotor under guaranteed dry conditions since the air which is drawn in and made available by the compressor still has more than 100° C. of heat.

The pattern comparison can be carried out especially after an off-line compressor wash. The ignition current which is then currently determined is fed via the current measurement transducer 30 to a subtraction point 94 in order to compare the currently determined ignition current with the values which are stored in the time and data register 63 as soon as the ignition voltage (Z=logic "1"-signal) is present, the wash has ended (W=logic "1"-signal) and the turning speed (Y=logic "1"-signal) of 2 Hz is achieved again. A differential quantity is then provided at the output 95 of the subtraction point 94, which fluctuates around a zero point if the flow of the actual ignition current and the flow of the stored ignition current do not conform, which points to a serviceable igniter 14. With the aid of a fourth limit-value monitor 96, an inverter 97, a fifth timer 98 and a sixth timer 99, deviations from the zero line can be determined. If the deviations on the one hand should be present for longer than a prespecified duration, then by an OR-gate 100, as a result of outputting a logic "1"-signal, the state of the igniter 14 is reported as being unserviceable.

If the ignitability of the igniter 14 in question should now have been impaired as a result of the water which is used during the off-line compressor wash, short circuits may occur, which result in a constant current flow which does not alternate around the trend line and is even possibly far below or above the lower limit value or upper limit value. As a result of the short circuits, there is no ignition voltage present at the electrode tips 20, as a result of which the ignition spark is also absent. Moreover, there is no influence as a result of the air mass flow, as a result of which the alternating signal waveform is absent.

If, for example, the gas turbine is equipped with a plurality of burners, wherein each burner has an igniter 14 associated with it, and wherein the burners open into a common combustion chamber in the form of an annular combustor, then the start permission of the gas turbine, which equates to the opening of the fuel valves, may be refused if after a wash program it is established that so many igniters 14 are impaired in their function as a result of moisture that a failed start of the gas turbine is probable. If this fault scenario is established with the aid of ignition devices 10, starting of the gas turbine can be delayed.

The ignition electrodes 16 can then be dried by means of preheating. The preheating can be achieved, for example, by enabling the ignition transformer 24 for a duration of about 30 seconds. Alternatively or additionally to this, by increasing the air mass flow (boiler purging), drying of the igniters, which are still probably moist, can be initiated. If during a subsequent repeated test ignition, or test measurement, a sufficient number of serviceable igniters—for example 75% of the igniter number—are identified, the gas turbine can be started without the risk of a failed ignition as a result of igniter problems.

In all, with the invention a method for determining a state of an electric igniter 14 of a gas turbine burner, and also a measuring device 12 and an ignition device 10 for a gas turbine burner, are disclosed, by means of which failed starts of gas turbines on account of unserviceable igniters can be avoided. The method provides that a time-dependent signal, which characterizes the ignition current of an igniter 14, is to be compared with an upper limit value and a lower limit value, and at the same time the characterizing signal is to be compared with a set-point current mean value around which the ignition current is to randomly fluctuate in the case of a serviceable igniter 14.

The invention claimed is:

1. A method for determining a state of an electric igniter of a gas turbine burner, comprising:
    comparing a time-dependent signal, which characterizes an ignition current of the electric igniter, with an upper limit value and a lower limit value; and
    comparing the characterizing time-dependent signal with a set-point current mean value,
    wherein the characterizing time-dependent signal describes a magnitude of the ignition current, and
    wherein in each case the upper limit value and the lower limit value are time-dependent, forming a set-point current envelope curve, and
    wherein the set-point current mean value is time-dependent, forming a set-point current trend characteristic.

2. The method as claimed in claim 1,
    wherein the state of the electric igniter is determined as being unserviceable when the characterizing time-dependent signal lies outside an interval which is formed by the upper limit value and the lower limit value for a first minimum duration.

3. The method as claimed in claim 1, wherein the state of the electric igniter is determined as being unserviceable when the characterizing time-dependent signal does not fluctuate around the set-point current mean value or set-point current trend characteristic for a second minimum duration.

4. The method as claimed in claim 1,
    wherein an ignition transformer is provided for generating an ignition voltage for a plurality of ignition electrodes, and
    wherein a primary-side current of the ignition transformer is measured as the ignition current.

5. The method as claimed in claim 1, wherein the comparisons are carried out by means of a plurality of pattern comparisons of current flows.

6. The method as claimed in claim 1, wherein the method is carried out during a rotation of a rotor of a gas turbine.

7. The method as claimed in claim 6, wherein a speed of the rotor is changed.

8. The method as claimed in claim 1, wherein the method is carried out before starting the gas turbine.

9. The method as claimed in claim 1, wherein a current flow of a serviceable igniter is determined in advance, from which current flow the set-point current trend characteristic is determined.

10. The method as claimed in claim 9, wherein the current flow of the serviceable igniter is measured after shutting down the gas turbine.

11. The method as claimed in claim 1, further comprising:
    determining a number of serviceable igniters of the burners of the gas turbine, and
    comparing the number with a prespecified minimum number of serviceable igniters,
    wherein, when the number is more than the prespecified minimum number of serviceable igniters, where the prespecified minimum number of serviceable igniters is less than a total number of igniters or burners, a fuel feed to the number of serviceable burners of the gas turbine is opened.

12. A measuring device for determining a state of an electric igniter of a gas turbine burner, comprising:
    a sensor for time-resolved measurement of a current signal of the electric igniter; and
    an evaluation device which is connected to the sensor, comprising:
        a memory,
        a means for comparing the current signal which is made available by the sensor, and
        a limit value which is stored in the memory,
    wherein three values, a first value, a second value, and a third value are stored in the evaluation device and differ in magnitude,
    wherein three means are provided for comparing the current signal with one of the three values in each case,
    wherein two of the three values, the first value and the second value, are time-dependent limiting values and form an envelope curve,
    wherein two of the three means are formed as limit-value comparators,
    wherein the third value is formed as a time-dependent set-point current trend characteristic, and
    wherein one of the three means is formed as a comparator which monitors the current signal for a flow which fluctuates around the set-point current trend characteristic.

13. The measuring device as claimed in claim 12, wherein the envelope curve and the set-point current trend characteristic are stored in a form of a characteristic line or in a table form.

14. The measuring device as claimed in claim 12, wherein the envelope curve or the set-point current trend characteristic is stored in a form of a characteristic line or in a table form.

15. A method for determining a state of an electric igniter of a gas turbine burner, comprising:
    comparing a time-dependent signal, which characterizes an ignition current of the electric igniter, with an upper limit value and a lower limit value; and
    comparing the characterizing time-dependent signal with a set-point current mean value,
    wherein the characterizing time-dependent signal describes a magnitude of the ignition current, and
    wherein in each case the upper limit value and the lower limit value are time-dependent, forming a set-point current envelope curve or the set-point current mean value is time-dependent, forming a set-point current trend characteristic.

* * * * *